(12) United States Patent
Teo et al.

(10) Patent No.: US 8,622,770 B2
(45) Date of Patent: Jan. 7, 2014

(54) ELECTROMAGNETIC RADIATION SHIELD FOR AN ELECTRONIC MODULE

(75) Inventors: Tat Ming Teo, Singapore (SG); Chris K. Togami, San Jose, CA (US); Frank J. Flens, Campbell, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 13/309,376

(22) Filed: Dec. 1, 2011

(65) Prior Publication Data

US 2013/0142490 A1 Jun. 6, 2013

(51) Int. Cl.
*H01R 13/648* (2006.01)

(52) U.S. Cl.
USPC ..................................................... 439/607.2

(58) Field of Classification Search
USPC .......................................... 439/607.2, 607.21
See application file for complete search history.

(56) References Cited

U.S. PATENT DOCUMENTS

| | | | | |
|---|---|---|---|---|
| 1,630,675 | A * | 5/1927 | Sinclair | 220/378 |
| 6,478,622 | B1 * | 11/2002 | Hwang | 439/607.2 |
| 6,878,872 | B2 * | 4/2005 | Lloyd et al. | 174/384 |
| 7,001,217 | B2 * | 2/2006 | Bright et al. | 439/607.2 |
| 7,557,306 | B2 * | 7/2009 | Chen et al. | 174/382 |
| 7,612,299 | B2 * | 11/2009 | Chen | 174/359 |
| 7,928,324 | B2 * | 4/2011 | Moore | 174/354 |
| 8,183,470 | B2 * | 5/2012 | Zhang et al. | 174/359 |
| 8,203,084 | B2 * | 6/2012 | Wertz et al. | 174/368 |
| 2006/0279937 | A1 * | 12/2006 | Manson et al. | 361/724 |

* cited by examiner

*Primary Examiner* — Gary Paumen
(74) *Attorney, Agent, or Firm* — Maschoff Brennan

(57) ABSTRACT

An electromagnetic radiation shield for an electronic module. In one example embodiment, an EMR shield for an electronic transceiver module includes a conductive carrier sized and configured to surround a shell of an electronic transceiver module. The conductive carrier defines a plurality of extended elements located on at least one edge of the conductive carrier and an orientation element. Each extended element is configured to bias against the shell in order to create a physical and electrical contact between the conductive carrier and the shell. The orientation element is configured to engage a corresponding structure in the shell in order to correctly orient the conductive carrier with respect to the shell.

25 Claims, 8 Drawing Sheets

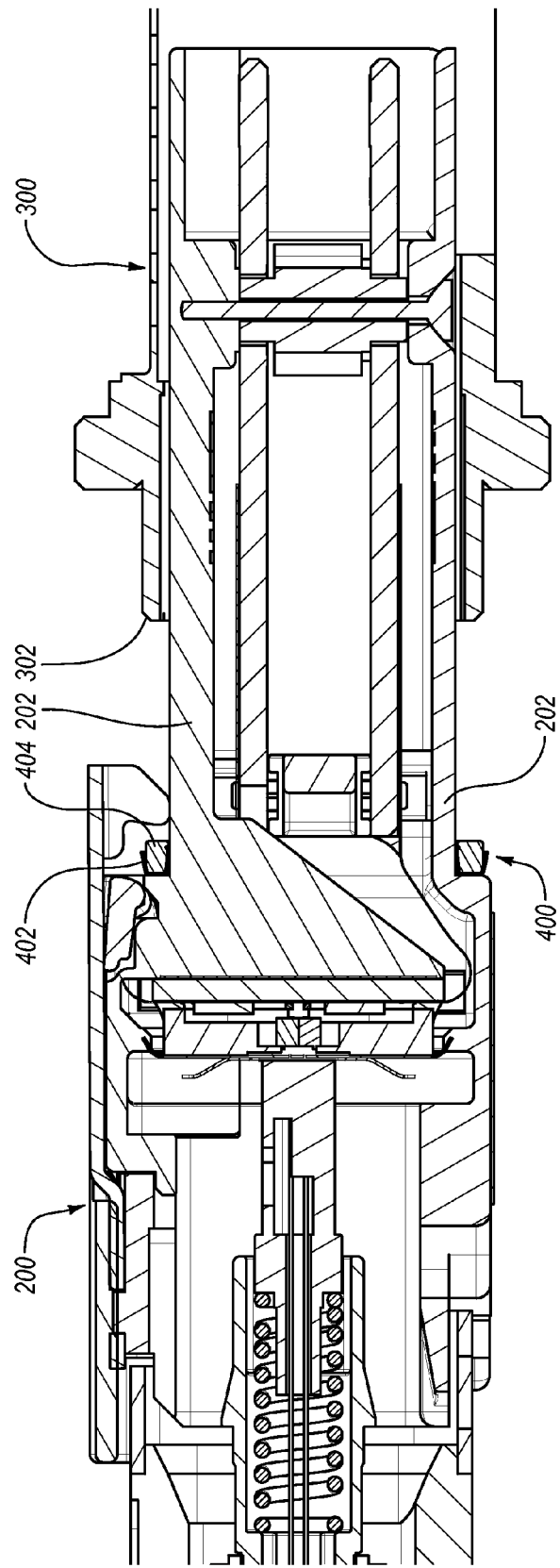

ly used in
ELECTROMAGNETIC RADIATION SHIELD FOR AN ELECTRONIC MODULE

BACKGROUND

Electronic modules, such as electronic or optoelectronic transceiver or transponder modules, are increasingly used in electronic and optoelectronic communication. Electronic modules typically communicate with a printed circuit board of a host device by transmitting electrical signals to the printed circuit board and receiving electrical signals from the printed circuit board. These electrical signals can then be transmitted by the electronic module outside the host device as optical and/or electrical signals.

One common difficulty associated with the operation of electronic modules is the emission of electromagnetic radiation ("EMR"). The generation of EMR by an electronic module or a host device is a matter of significant concern because emitted EMR can cause electromagnetic interference ("EMI") in other systems and devices in the vicinity, which can seriously impair, if not prevent, the proper operation of those other systems and devices. Thus, the control of EMR emissions is an important consideration in the design and use of electronic modules.

BRIEF SUMMARY OF SOME EXAMPLE EMBODIMENTS

In general, example embodiments relate to an electromagnetic radiation shield for an electronic module. The example electromagnetic radiation ("EMR") shields disclosed herein can be employed in connection with an electronic module positioned in a host device. When so employed, the example EMR shields can help maintain EMR emitted outside the host device at acceptably low levels to avoid electromagnetic interference ("EMI") in surrounding devices.

In one example embodiment, an EMR shield for an electronic transceiver module includes a conductive carrier sized and configured to surround a shell of an electronic transceiver module. The conductive carrier defines a plurality of extended elements located on at least one edge of the conductive carrier and an orientation element. Each extended element is configured to bias against the shell in order to create a physical and electrical contact between the conductive carrier and the shell. The orientation element is configured to engage a corresponding structure in the shell in order to correctly orient the conductive carrier with respect to the shell.

In another example embodiment, an electronic transceiver module includes a shell, a printed circuit board (PCB) at least partially positioned within the shell, a transmitter electrically connected to the PCB, a receiver electrically connected to the PCB, and an EMR shield. The EMR shield includes a conductive carrier and a conductive foam. The conductive carrier surrounds the shell and defines a plurality of extended elements located on at least one edge of the conductive carrier. Each extended element is biased against the shell in order to create a physical and electrical contact between the conductive carrier and the shell. The conductive foam surrounds the shell and is supported by and in electrical contact with the conductive carrier.

In yet another example embodiment, an active cable includes a fiber-optic communications cable and first and second optoelectronic transceiver modules. The fiber-optic communications cable includes one or more optical data transmission lines and has first and second ends. The first and second optoelectronic transceiver modules are attached to the first and second ends of the fiber-optic communications cable. Each optoelectronic transceiver module includes a shell, a PCB at least partially positioned within the shell, one or more optical transmitters electrically connected to the PCB, one or more optical receivers electrically connected to the PCB, and an EMR shield. The EMR shield includes a conductive carrier surrounding the shell and a conductive foam surrounding the shell and attached to the conductive carrier. The conductive carrier defines a plurality of extended elements located on at least one edge of the conductive carrier. Each extended element is biased against the shell in order to create a physical and electrical contact between the conductive carrier and the shell. The conductive foam is configured to physically and electrically engage a cage of a host device when the electronic transceiver module is inserted into the cage.

These and other aspects of example embodiments of the invention will become more fully apparent from the following description and appended claims.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which:

FIG. 6A is a cross-sectional side view of FIG. 5A; and

DETAILED DESCRIPTION OF SOME EXAMPLE EMBODIMENTS

Example embodiments of the invention relate to an electromagnetic radiation shield for an electronic module. The example electromagnetic radiation ("EMR") shield disclosed herein can be employed in connection with an electronic module positioned in a host device. When so employed, the example EMR shield can help maintain EMR emitted outside the host device at acceptably low levels to avoid electromagnetic interference ("EMI") in surrounding devices.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

1. Example Active Cable

Figure 1:
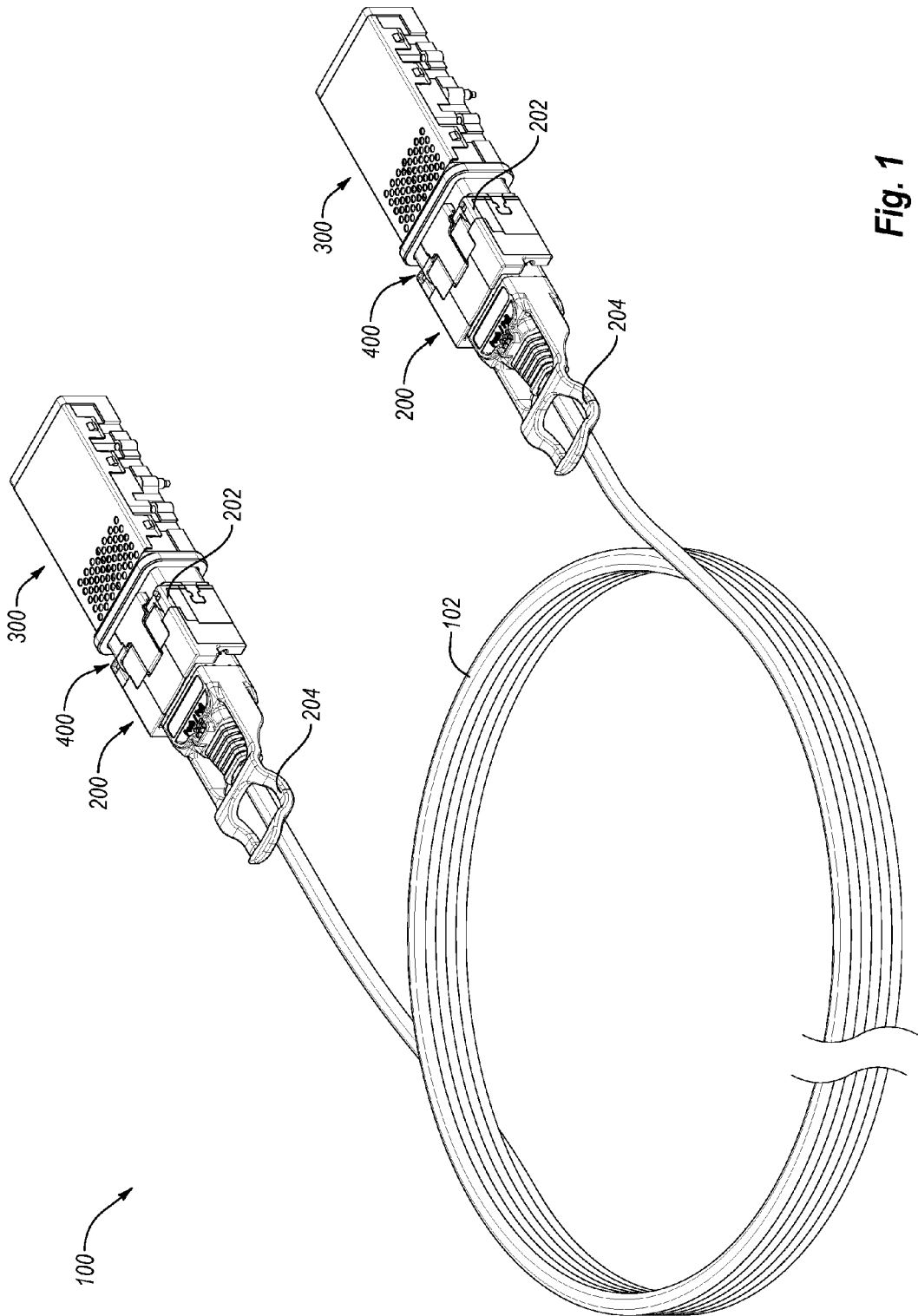
FIG. 1 is a perspective view of an example active cable including an example fiber-optic communications cable terminated on both ends by example optoelectronic modules with the example optoelectronic modules received within host device cages.

Reference is first made to FIG. 1 which discloses an example active cable 100. The example active cable 100 is configured to physically connect two host devices together for optical and electrical data communication. The example active cable 100 includes a communications cable 102 and two identical optoelectronic transceiver modules 200 attached to the first and second ends of the communications cable 102.

The communications cable 102 is multichannel fiber-optic ribbon communications cable having twenty four (24) fibers, with twelve (12) of the fibers being employed to transfer data signals in one direction, and the other twelve (12) fibers being employed to transfer data signals in the opposite direction. It is understood, however, that the communications cable 102 could instead have a fewer or greater number of fibers, including a single fiber, or alternatively be an electrical communications cables including one or more electrical data transmission lines such as a Category 5 (CAT-5) cable.

As disclosed in FIG. 1, the communications cable 102 is permanently attached to each of the transceiver modules 200. However, it is understood that the communications cable 102 can alternatively be pluggably attached to one or both of the transceiver modules 200. For example, where the communications cable 102 is a fiber-optic communications cable, the communications cable 102 can be terminated on one or both ends with a multi-fiber push on (MPO) male connector and one or both of the transceiver modules 200 can include a corresponding MPO female connector configured to pluggably receive the MPO male connector. Alternatively, where the communications cable 102 is an electrical communications cable, the communications cable 102 can be terminated on one or both ends with a registered jack 45 (RJ-45) male connector and one or both of the transceiver modules 200 can include a corresponding RJ-45 female connector configured to pluggably receive the RJ-45 male connector. Thus, although the example EMR shields disclosed herein can be employed in connection with the transceiver modules 200 as part of the example active cable 100, it is understood that the EMR shields disclosed herein can alternatively be employed in connection with standalone electronic modules that are not permanently attached to a communications cable.

Figure 2:
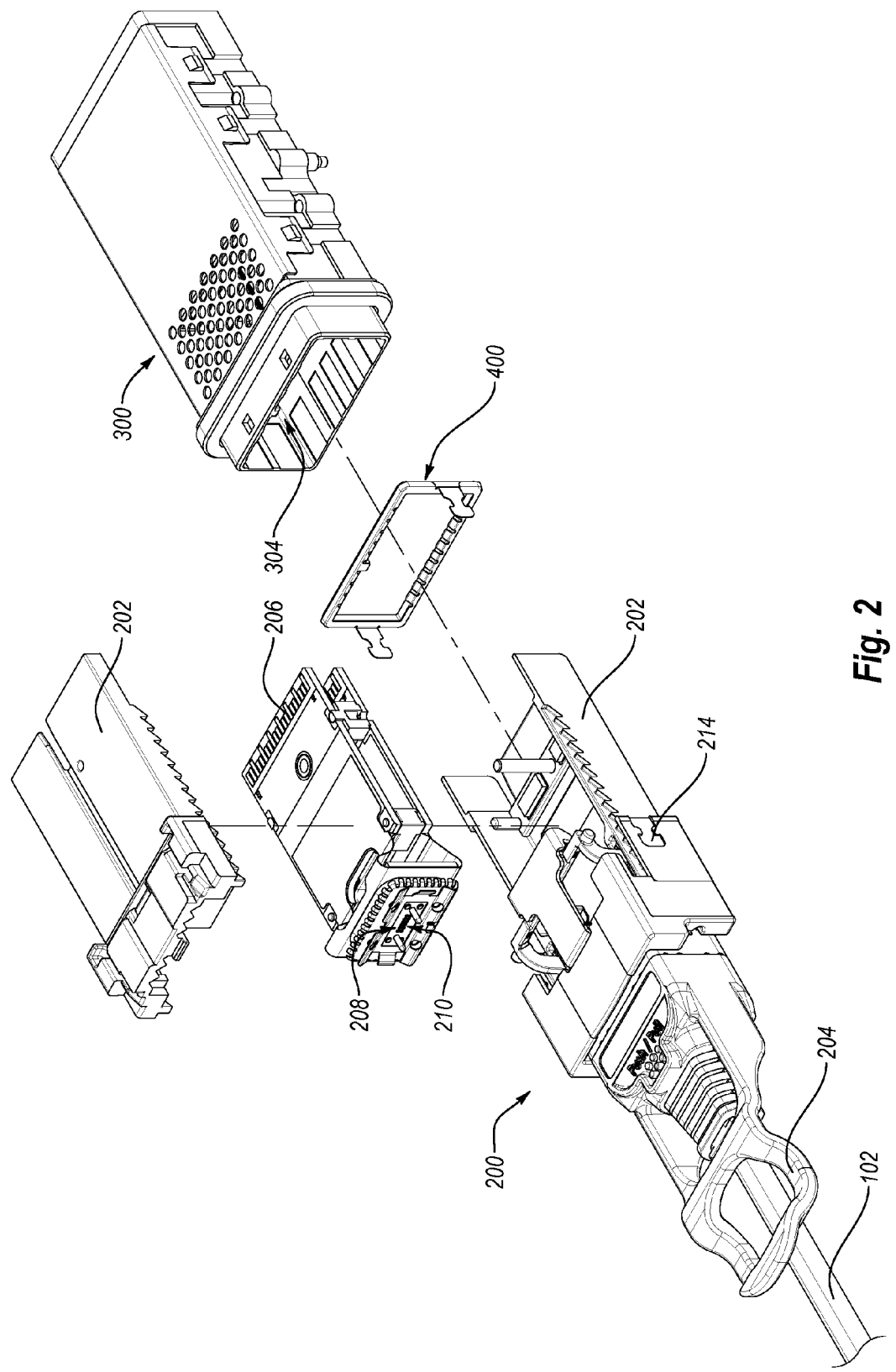
FIG. 2 is a perspective exploded view of one of the optoelectronic modules of the active cable of FIG. 1 and the corresponding host device cage of FIG. 1.

With reference now to FIGS. 1 and 2, each transceiver module 200 includes a shell 202 attached to a latching handle 204. The latching handle 204 can be employed to insert the transceiver module 200 into a cage 300 of a host device (not shown). Once inserted into the cage 300 of the host device, the latching handle 204 engages the cage 300 to securely maintain the transceiver module 200 in the cage 300. The latching handle 204 functions such that when the latching handle 204 is pulled, the latching handle 204 disengages from the cage 300 of the host device, thus allowing the transceiver module 200 to be extracted from the cage 300.

As disclosed in FIG. 2, each transceiver module 200 further includes a printed circuit board (PCB) 206 at least partially positioned within the shell 202, optical transmitters 208 electrically connected to the PCB 206, and optical receivers 210 electrically connected to the PCB 206. The optical transmitters 208 of the transceiver module are configured to convert electrical signals received through the PCB 206 from the host device (not shown) of the cage 300 into corresponding optical signals. Similarly, the optical receivers 210 of the transceiver module 200 are configured to convert optical signals received from the fiber-optic ribbon communications cable 102 into corresponding electrical signals for transmission to the host device (not shown) of the cage 300 through the PCB 106.

Each transceiver module 200 can be configured for optical signal transmission and reception at a variety of data rates including, but not limited to, 150 Gb/s or higher. Further, each transceiver module 200 can be configured to support various transmission standards including, but not limited to, Infini-Band, Fibre Channel, 100 G Ethernet, SAS/SATA, and PCIe. In addition, although each transceiver module 200 is configured to have a form factor that is substantially compliant with the CXP MSA, each transceiver module 200 can alternatively be configured to have one of a variety of different form factors that are substantially compliant with other MSAs including, but not limited to, the SFP+MSA, the XFP MSA, the QSFP MSA, the X2 MSA, the XENPAK MSA, and the XPAK MSA.

As disclosed in FIGS. 1 and 2, each of the transceiver modules 200 also includes an example EMR shield 400. The EMR shields 400 can be employed to help maintain EMR emitted outside the host devices (not shown) through the module openings 304 in the cages 300 at acceptably low levels to avoid electromagnetic interference ("EMI") in surrounding devices. Addition detail regarding the EMR shields 400 will be disclosed below in connections with FIGS. 3A-6B.

2. Example EMR Shields

Figure 3A:
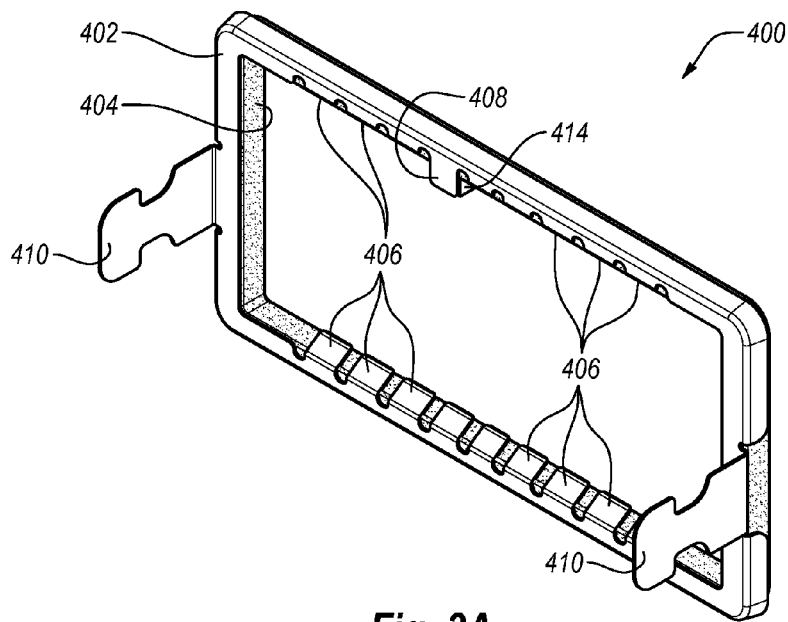
FIG. 3A is a perspective view of an example electromagnetic radiation ("EMR") shield of the example optoelectronic module of FIG. 2.
Figure 3B:
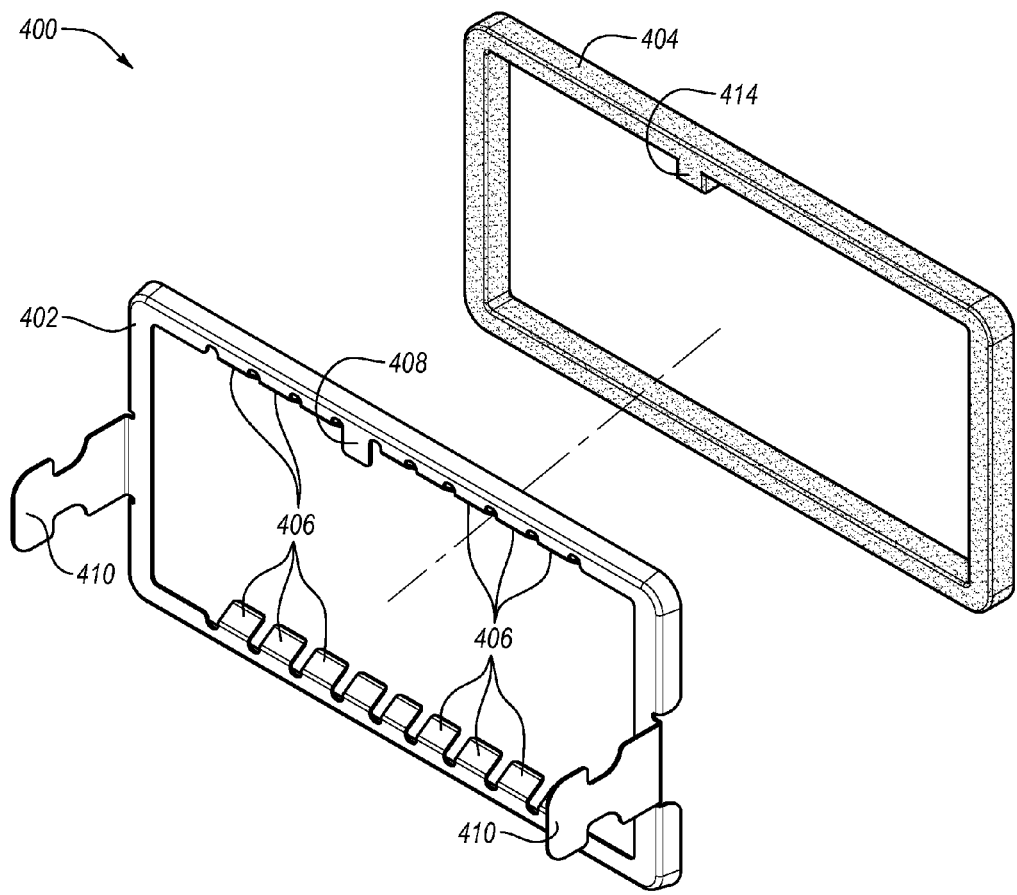
FIG. 3B is a perspective exploded view of the example EMR shield of FIG. 3A.

With reference now to FIGS. 3A and 3B, additional aspects of the example EMR shield 400 will be disclosed. As disclosed in FIGS. 3A and 3B, each EMR shield 400 includes a conductive carrier 402 and may include a conductive foam 404. The conductive carrier 402 is sized and configured to surround the shell 202 of the transceiver module 200 (see FIG. 2). The conductive carrier can be formed from a relatively sturdy conductive material such 301 stainless steel sheet metal that is ¾ spring hard and about 0.08 mm thick, for example. The conductive carrier 402 defines a plurality of extended elements 406 located on at least one edge of the conductive carrier 402, an orientation element 408, two locking elements 410, and a cavity 412. As disclosed in FIG. 3B, the locking elements 410 are oriented about perpendicular to the orientation element 408.

Although the example EMR shield 400 is disclosed in FIGS. 3A and 3B as including the conductive foam 404, it is understood that the conductive carrier 402 may also be effective at shielding EMR without the conductive foam 404. Thus, the conductive carrier 202 may or may not be employed in connection with the conductive foam 404, as disclosed in the alternative embodiments of FIGS. 4A and 4B.

Figure 4A:
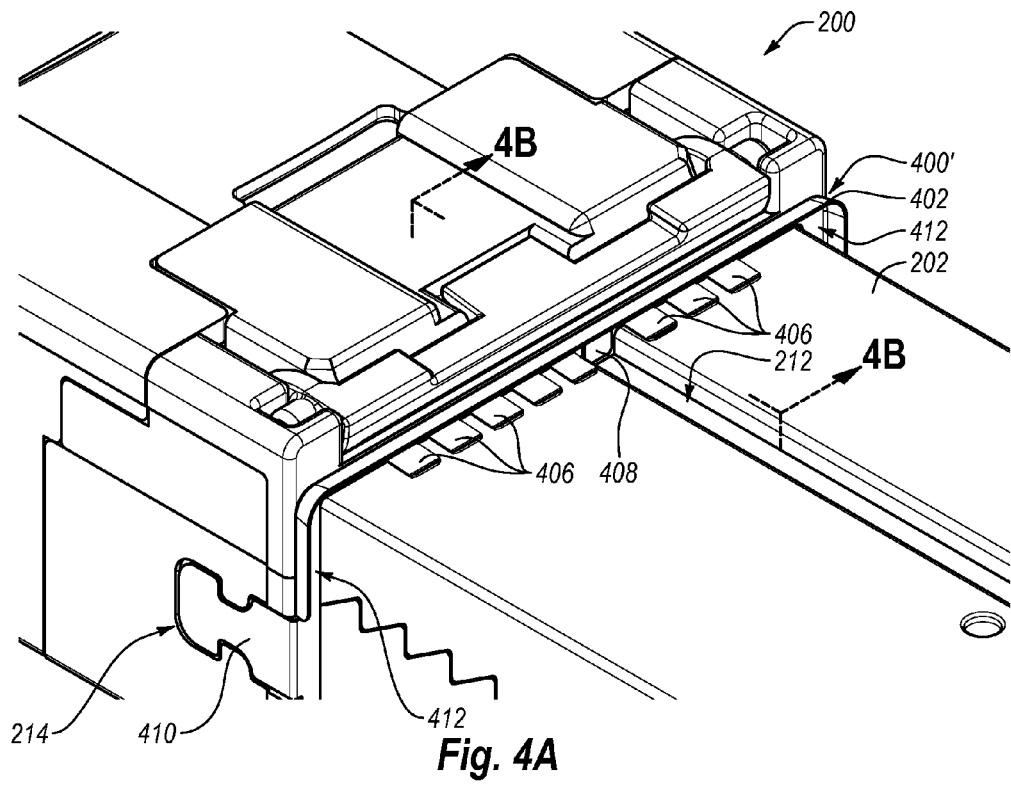
FIG. 4A is a partial perspective view of an alternative embodiment of the example EMR shield of FIG. 3A installed on the example optoelectronic module of FIG. 3A.
Figure 4B:
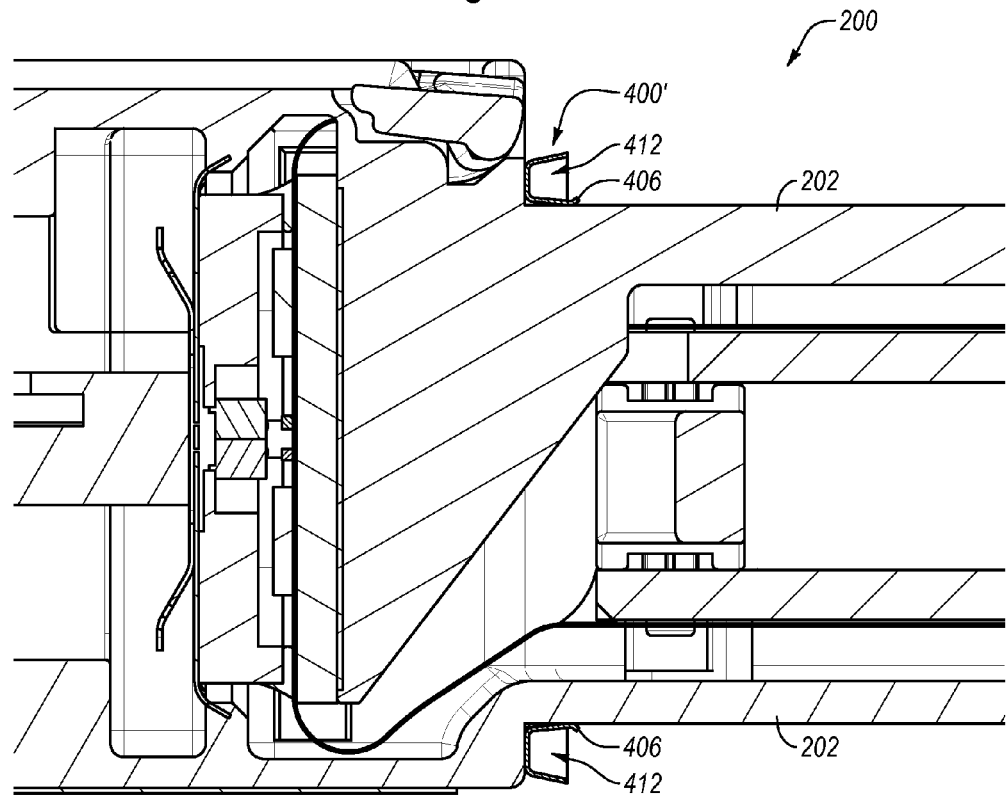
FIG. 4B is a cross-sectional view of the alternative embodiment of the example EMR shield of FIG. 4A installed on the example optoelectronic module of FIG. 4A.

With reference now to FIGS. 4A and 4B, an alternative EMR shield 400' is disclosed which includes the conductive carrier 402 and not the conductive foam 404. As disclosed in FIGS. 4A and 4B, each extended element 406 of the conductive carrier 402 is configured to bias against the shell 202 in order to create a physical and electrical contact between the conductive carrier 402 and the shell 202. As disclosed in FIG. 4A, the orientation element 408 is configured to engage a corresponding structure 212 in the shell 202 in order to correctly orient the conductive carrier 402 with respect to the shell 202. As disclosed in FIG. 4A, each locking element 410 is configured to engage two corresponding locking structures 214 (see also FIG. 2) defined in the shell 202 in order to properly position the conductive carrier 402 around the shell 202. As disclosed in FIGS. 4A and 4B, the cavity 412 is sized and configured to receive the conductive foam 404 (see FIGS. 3A and 3B) and have the conductive foam 404 at least partially positioned therein.

For example, as disclosed in FIG. 3A, the conductive 404 foam can be attached to the conductive carrier 402 within the cavity 412 (see FIGS. 4A and 4B) using a conductive adhesive, such as the electrically conductive adhesive 3M 9712 for example. Thus, the relatively sturdy conductive carrier 402 can help to support, position, and reduce damage to the relatively flexible conductive foam 404, both during assembly of the transceiver module 200 and during insertion and extraction of the transceiver module 200 from the cage 300.

As disclosed in FIGS. 3A and 3B, the conductive foam 404 is also sized and configured to surround the shell 202 (see FIG. 2). The conductive foam may also define an orientation structure 414 corresponding to the orientation element 408 of the conductive carrier 402. The conductive foam 404 is formed from a conductive material that is generally effective and shielding EMR. For example, the conductive foam 404 may be formed from silicone and filled with nickel and graphite. In one example embodiment, the conductive foam 404 may be formed from TennVac S-3311.

2. Example EMR Shield Function

Figure 5A:
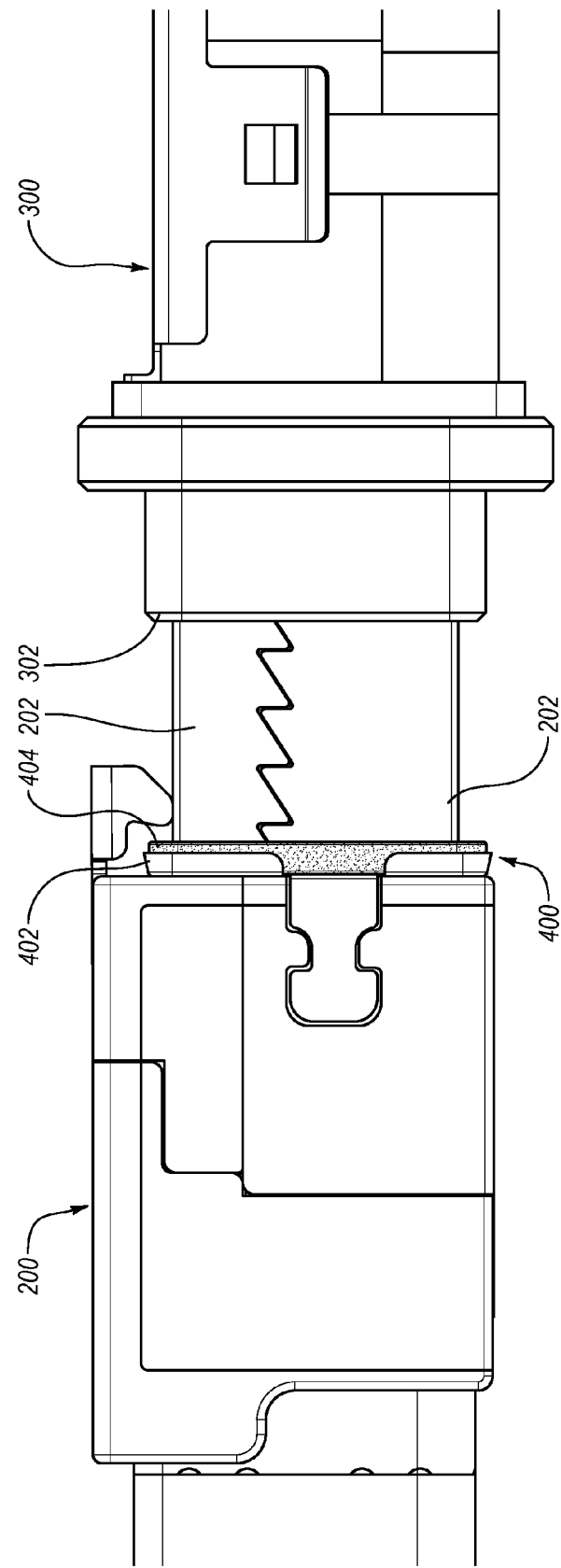
FIG. 5A is a side view of the optoelectronic module of FIG. 2 partially inserted into the corresponding host device cage of FIG. 2.
Figure 5B:
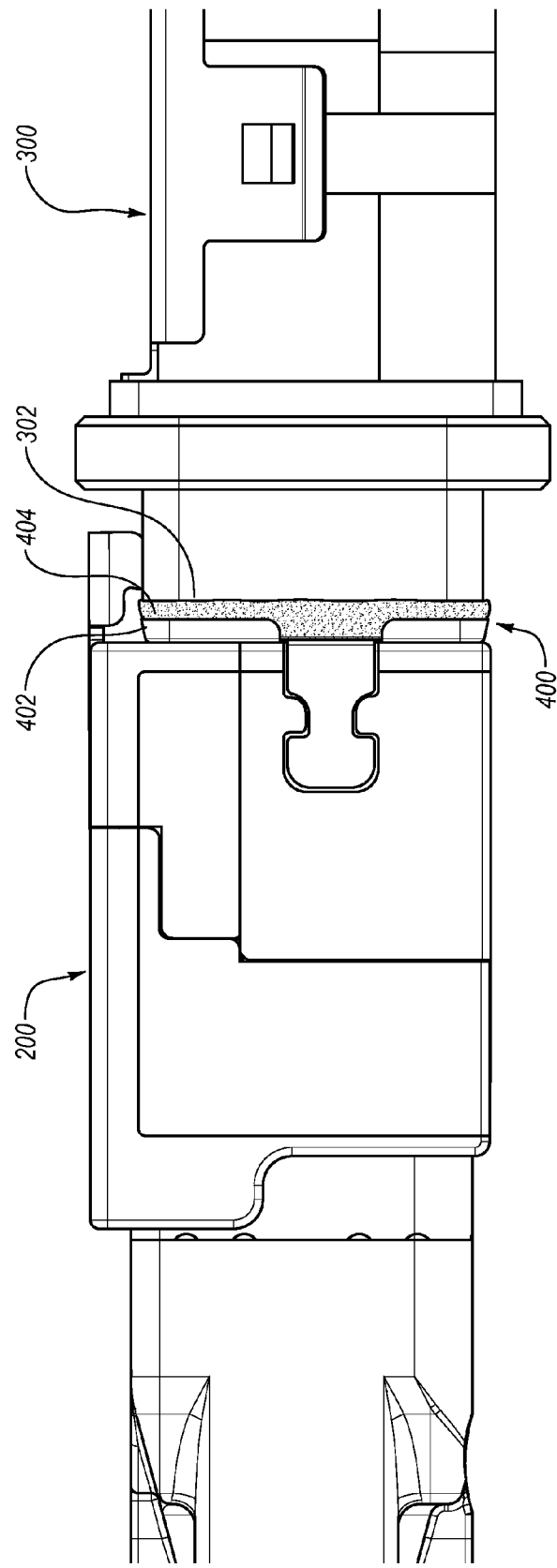
FIG. 5B is a side view of the optoelectronic module of FIG. 5A fully inserted into the corresponding host device cage of FIG. 5A.
Figure 6B:
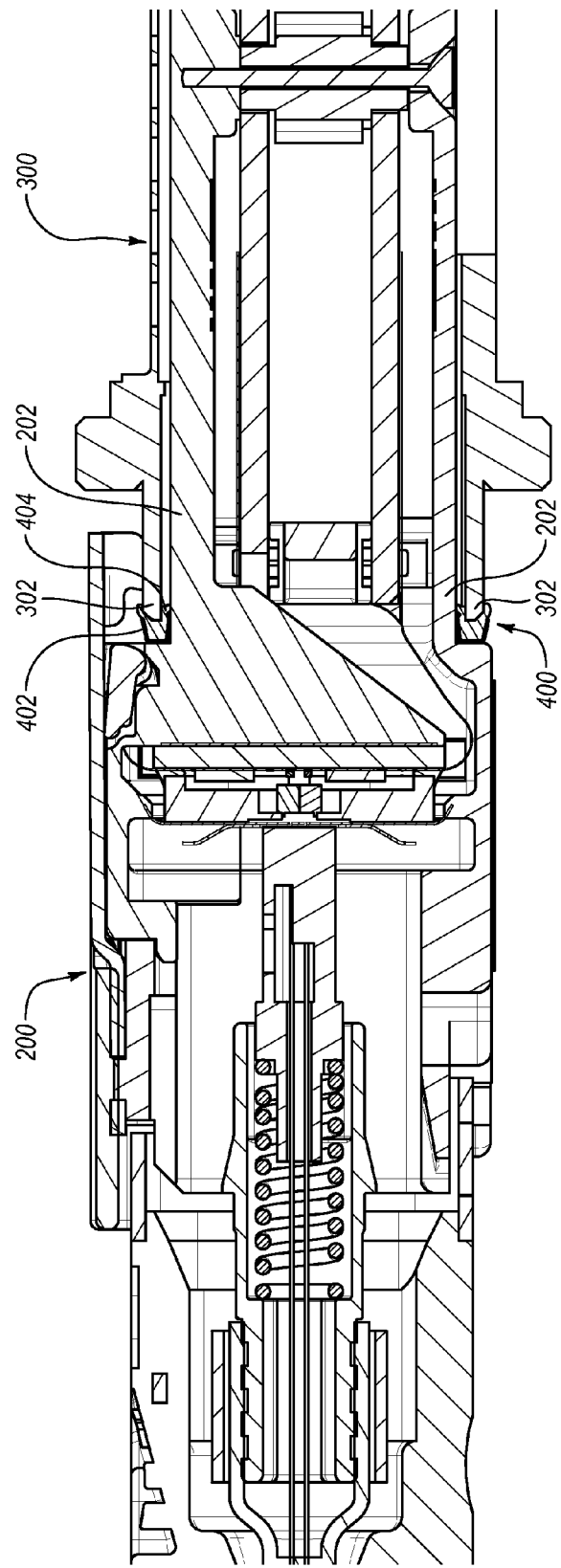
FIG. 6B is a cross-sectional side view of FIG. 5B.

As disclosed in FIGS. 5A and 6A, before the transceiver module 200 is inserted into the cage 300 of the host device (not shown), the conductive carrier 402 is in physical and electrical contact with the shell 202 of the transceiver module and the conductive foam 404 is attached to, supported by, and in electrical contact with the conductive carrier 402. Then, as disclosed in FIGS. 5B and 6B, once the transceiver module 200 is inserted into the cage 300 of the host device (not shown), the conductive carrier 402 remains in physical and electrical contact with the shell 202 of the transceiver module and the conductive foam 404 remains attached to, supported by, and in electrical contact with the conductive carrier 402, but the conductive foam 404 also comes into physical and electrical contact with an edge 302 of the opening 304 (see FIG. 2) in the cage 300, thus creating a seal that reduces or prevents EMR from emitting out of the opening 304, thus reducing or preventing EMI in surrounding devices The example embodiments disclosed herein may be embodied in other specific forms. The example embodiments disclosed herein are to be considered in all respects only as illustrative and not restrictive.

What is claimed is:

1. An electromagnetic radiation ("EMR") shield for an electronic transceiver module, the electromagnetic shield comprising:
   a conductive carrier sized and configured to surround a shell of an electronic transceiver module, the conductive carrier defining:
      a plurality of extended elements located on at least one edge of the conductive carrier, each extended element configured to bias against the shell in order to create a physical and electrical contact between the conductive carrier and the shell;
      an orientation element configured to engage a corresponding structure in the shell in order to correctly orient the conductive carrier with respect to the shell; and
      an opening into which the orientation element at least partially extends.

2. The EMR shield as recited in claim 1, further comprising a conductive foam attached to and in electrical contact with the conductive carrier and sized and configured to surround the shell.

3. The EMR shield as recited in claim 2, wherein the conductive foam is formed from TennVac S-3311.

4. The EMR shield as recited in claim 2, wherein the conductive carrier further defines a cavity in which the conductive foam is at least partially positioned.

5. The EMR shield as recited in claim 2, wherein the conductive carrier further defines two flat hour-glass shaped locking elements configured to fit within two similarly shaped recessed areas defined in the shell in order to properly position the EMR shield around the shell.

6. The EMR shield as recited in claim 5, wherein the locking elements are oriented about perpendicular to the orientation element.

7. The EMR shield as recited in claim 2, wherein the conductive foam defines an orientation structure corresponding to the orientation element of the conductive carrier.

8. The EMR shield as recited in claim 2, wherein the conductive foam is configured to physically and electrically engage a cage of a host device when the conductive carrier and the conductive foam are surrounding the shell of the electronic transceiver module and when the electronic transceiver module is inserted into the cage.

9. An electronic transceiver module comprising:
   a shell defining two recessed locking structures;
   a printed circuit board (PCB) at least partially positioned within the shell;
   a transmitter electrically connected to the PCB;
   a receiver electrically connected to the PCB; and
   an EMR shield comprising:
      a conductive carrier surrounding the shell, the conductive carrier defining a plurality of extended elements located on at least one edge of the conductive carrier, each extended element biased against the shell in order to create a physical and electrical contact between the conductive carrier and the shell, the conductive carrier further defining two locking elements engaged substantially within the two recessed locking structures defined in the shell such that the exposed surface of the locking elements is substantially planar with the exposed surface of the shell surrounding the recessed locking structures in order to properly position the EMR shield around the shell; and
      a conductive foam surrounding the shell and supported by and in electrical contact with the conductive carrier.

10. The electronic transceiver module as recited in claim 9, wherein the conductive carrier further defines an orientation element engaging a corresponding structure in the shell in order to correctly orient the conductive carrier with respect to the shell.

11. The electronic transceiver module as recited in claim 10, wherein the conductive foam defines an orientation structure corresponding to the orientation element of the conductive carrier.

12. The electronic transceiver module as recited in claim 9, wherein the conductive foam is formed from TennVac S-3311.

13. The electronic transceiver module as recited in claim 9, wherein the conductive carrier further defines a cavity in which the conductive foam is at least partially positioned.

14. The electronic transceiver module as recited in claim 10, wherein the locking elements are oriented about perpendicular to the orientation element.

15. The electronic transceiver module as recited in claim 9, wherein the electronic transceiver module has a form factor that is substantially compliant with one of the CXP MSA, the SFP+ MSA, the XFP MSA, the QSFP MSA, the X2 MSA, the XENPAK MSA, and the XPAK MSA.

16. The electronic transceiver module as recited in claim 10, wherein:
the corresponding structure in the shell includes a channel defined in the shell that extends from one edge of the shell to at least the portion of the shell that is surrounded by the conductive carrier, and
the orientation element extends at least partially into the channel of the shell in order to correctly orient the conductive carrier with respect to the shell.

17. The electronic transceiver module as recited in claim 16, wherein the conductive foam is configured to physically and electrically engage a cage of a host device when the electronic transceiver module is inserted into the cage.

18. The electronic transceiver module as recited in claim 9, wherein the two locking elements are flat hour-glass shaped locking elements and the two recessed locking structures are flat hour-glass shaped recessed locking structures.

19. An active cable comprising:
a fiber-optic communications cable comprising one or more optical data transmission lines, the fiber-optic communications cable having first and second ends; and
first and second optoelectronic transceiver modules attached to the first and second ends of the fiber-optic communications cable, respectively, each optoelectronic transceiver module comprising:
a shell defining a channel that extends from one edge of the shell to an intermediate portion of the shell;
a PCB at least partially positioned within the shell;
one or more optical transmitters electrically connected to the PCB;
one or more optical receivers electrically connected to the PCB; and
an EMR shield comprising:
a conductive carrier surrounding the intermediate portion of the shell, the conductive carrier defining a plurality of extended elements located on at least one edge of the conductive carrier, each extended element biased against the shell in order to create a physical and electrical contact between the conductive carrier and the shell, the conductive carrier further defining an orientation element that extends into the channel defined in the shell in order to correctly orient the conductive carrier with respect to the shell; and
a conductive foam surrounding the shell and attached to the conductive carrier, the conductive foam configured to physically and electrically engage a cage of a host device when the electronic transceiver module is inserted into the cage, the conductive foam defining an orientation structure corresponding to the orientation element of the conductive carrier, the orientation element of the conductive foam also extending into the channel defined in the shell.

20. The active cable as recited in claim 19, wherein the conductive carrier further defines two locking elements engaged with two corresponding locking structures defined in the shell in order to properly position the EMR shield around the shell, the locking elements being oriented about perpendicular to the orientation element.

21. The active cable as recited in claim 19, wherein the conductive foam is formed from TennVac S-3311.

22. The active cable as recited in claim 19, wherein the conductive carrier further defines a cavity in which the conductive foam is at least partially positioned.

23. The active cable as recited in claim 19, wherein each of the optoelectronic transceiver modules has a form factor that is substantially compliant with the CXP MSA.

24. The active cable as recited in claim 19, wherein the conductive foam is configured to physically and electrically engage a cage of a host device when the electronic transceiver module is inserted into the cage.

25. The active cable as recited in claim 20, wherein the two locking elements are flat hour-glass shaped locking elements and the two locking structures are flat hour-glass shaped locking structures.

* * * * *